United States Patent
Rodriguez Alvarez et al.

(10) Patent No.: US 12,255,068 B2
(45) Date of Patent: Mar. 18, 2025

(54) METHOD FOR FORMING AN ELECTRICAL CONTACT AND METHOD FOR FORMING A SEMICONDUCTOR DEVICE

(71) Applicant: Robert Bosch GmbH, Stuttgart (DE)

(72) Inventors: Humberto Rodriguez Alvarez, Kornwestheim (DE); Jan-Hendrik Alsmeier, Pfullingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 377 days.

(21) Appl. No.: 17/774,063

(22) PCT Filed: Nov. 5, 2020

(86) PCT No.: PCT/EP2020/081084
§ 371 (c)(1),
(2) Date: May 3, 2022

(87) PCT Pub. No.: WO2021/110348
PCT Pub. Date: Jun. 10, 2021

(65) Prior Publication Data
US 2023/0005747 A1    Jan. 5, 2023

(30) Foreign Application Priority Data
Dec. 3, 2019 (DE) ............ 10 2019 218 725.0

(51) Int. Cl.
*H01L 21/04*    (2006.01)
*H01L 29/45*    (2006.01)
*H01L 29/16*    (2006.01)

(52) U.S. Cl.
CPC .......... *H01L 21/0485* (2013.01); *H01L 29/45* (2013.01); *H01L 29/1608* (2013.01)

(58) Field of Classification Search
CPC .............. H01L 21/0485; H01L 21/268; H01L 29/1608; H01L 29/45; B24D 3/06
See application file for complete search history.

(56) References Cited

U.S. PATENT DOCUMENTS 5,921,856 A    7/1999   Zimmer
8,216,929 B2   7/2012   Kawai et al.
(Continued)

FOREIGN PATENT DOCUMENTS

EP    3131112 A1   2/2017
JP    2008135611 A   6/2008
(Continued)

OTHER PUBLICATIONS

International Search Report for PCT/EP2020/081084, Issued Mar. 12, 2021.

*Primary Examiner* — Brook Kebede
(74) *Attorney, Agent, or Firm* — NORTON ROSE FULBRIGHT US LLP; Gerard A. Messina

(57) ABSTRACT

A method for forming an electrical contact is provided. The method includes grinding a silicon carbide surface using a grinding disk which includes a grinding face containing nickel or a nickel compound, such that particles of the nickel or nickel compound from the grinding disk are embedded in the ground silicon carbide surface, and hardening the ground silicon carbide surface with the aid of a laser, such that at least some of the embedded nickel particles form a nickel silicide with silicon from the silicon carbide.

12 Claims, 2 Drawing Sheets

(56) References Cited

U.S. PATENT DOCUMENTS

| | | | |
|---|---|---|---|
| 8,962,468 B1 * | 2/2015 | Hostetler | H01L 29/1608 438/602 |
| 2011/0306188 A1 | 12/2011 | Kawai et al. | |

FOREIGN PATENT DOCUMENTS

| | | | | |
|---|---|---|---|---|
| JP | 2011096905 A | * | 5/2011 | H01L 21/0485 |
| JP | 2016017926 A | | 2/2016 | |

* cited by examiner

METHOD FOR FORMING AN ELECTRICAL CONTACT AND METHOD FOR FORMING A SEMICONDUCTOR DEVICE

FIELD

The present invention relates to a method for forming an electrical contact, and a method for forming a semiconductor device.

BACKGROUND INFORMATION

Silicon carbide is a semiconductor material that is increasingly used, in particular in the last few years, in the semiconductor industry.

U.S. Pat. No. 8,216,929 B2 describes a method for forming an electrical contact (of a semiconductor device) on a silicon carbide substrate, in which, first, a surface of the silicon carbide substrate is processed such that its average roughness is less than 10 nm. Then, the surface is damaged by a plasma, after which, in a subsequent process, a thin metal layer is applied to the damaged surface. Finally, the thin metal layer is irradiated with laser light.

SUMMARY

An object of the present invention includes providing a method for forming an electrical contact on a silicon carbide surface, which has a smaller number of process steps.

Various exemplary embodiments of the present invention provide a method for forming an electrical contact. The method may include grinding a silicon carbide surface using a grinding disk which includes a grinding face containing nickel or a nickel compound.

In this case, grinding may be performed such that particles of the nickel or nickel compound from the grinding disk are embedded in the ground silicon carbide surface. Furthermore, the method may include hardening the ground silicon carbide surface with the aid of a laser, which may be performed such that at least some of the embedded nickel particles form a nickel silicide with silicon from the silicon carbide.

The described method in accordance with the present invention may be utilized in various exemplary embodiments in order to form a silicon carbide semiconductor device, such as a transistor, a MOSFET, or a power MOSFET.

The method described above can make it possible to form an ohmic contact on a silicon carbide (SiC) substrate. The electrical (ohmic) contact may be formed between the silicon carbide and the nickel silicide.

In various exemplary embodiments of the present invention, damage/roughening of the silicon carbide surface and the arrangement of metal on or in the damaged/roughened surface may be combined into one process. In this case, a grinding tool that is used for processing the surface may be configured such that, when the silicon carbide surface is processed, metal particles are shed by the grinding tool and are embedded in the damaged/roughened surface.

In the text below, the term "grinding disk" is used for the grinding tool. However, it should be understood that the shape of the grinding tool may be different from the widely used disk shape. The grinding tool may for example be a grinding wheel, in the form of a belt or cylinder, or may take another suitable shape.

In various exemplary embodiments of the present invention, a method for manufacturing an electrical contact on silicon carbide is provided, in which it is possible to dispense with the provision of two separate processes for providing a surface, on the one hand, and the deposition/embedding of metal in the surface, on the other.

Combining the roughening/damage to the surface with the embedding of nickel in the surface—or to put it another way, dispensing with a separate deposition process for the metal—may mean that manufacturing costs for forming the electrically conductive connection are reduced.

In various exemplary embodiments of the present invention, the making of an electrically conductive connection may be simplified in that grinding of a silicon carbide surface with a nickel-containing grinding disk and laser hardening may be sufficient to form the electrically conductive connection with the silicon carbide.

Grinding may be performed such that the silicon carbide substrate is thinned to a thickness of approximately 50 μm to 200 μm, it being possible for the ground surface to have an average roughness of more than 10 nm, and for crystal defects, and nickel particles incorporated with the aid of the grinding disk, to be located below the ground surface to a depth of at least approximately 10 nm and at most approximately 500 nm.

Furthermore, the hardening may be carried out such that the crystal defects in the layer below the surface are reduced, at least some of the embedded nickel reacts with the silicon in the silicon carbide (for example forming nickel silicide), and an ohmic contact with a contact resistance of less than 1 mΩcm$^2$ is formed.

Further developments of the aspects of the present invention are disclosed herein. Specific embodiments of the present invention are presented in the figures and explained in more detail in the description below.

DETAILED DESCRIPTION OF EXAMPLE EMBODIMENTS

Figure 1A:
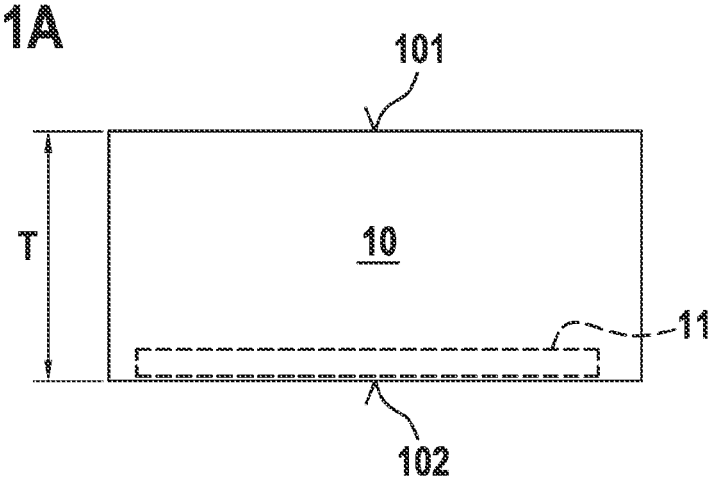
FIGS. 1A to 1C show a schematic illustration of a method for forming an electrical contact according to various exemplary embodiments of the present invention.
Figure 1B:
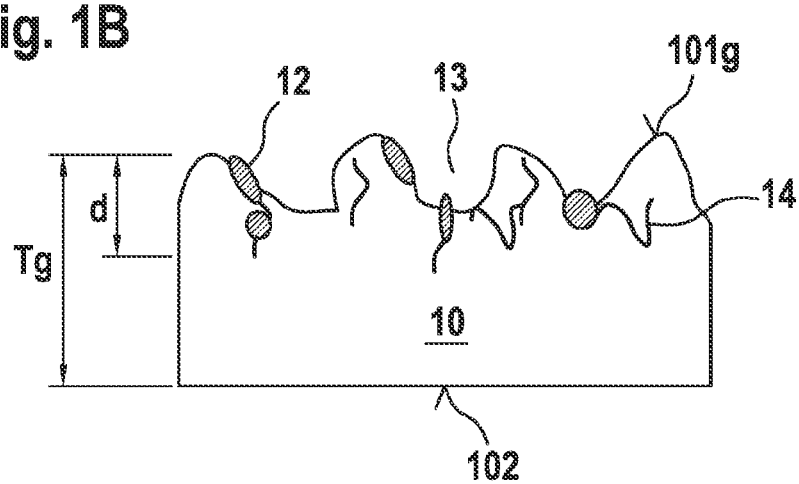
Figure 1C:
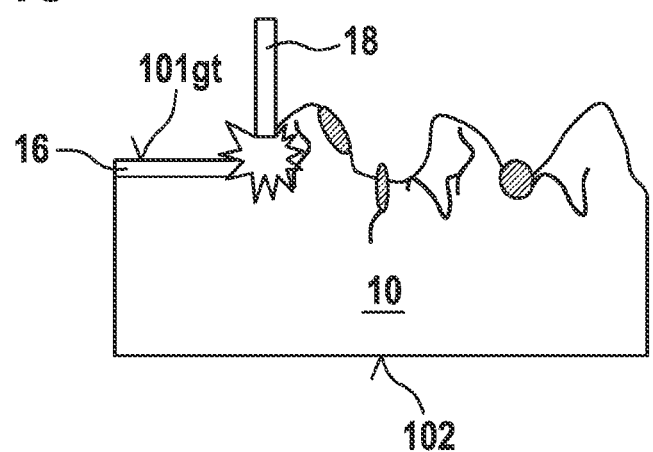

FIGS. 1A to 1C show a schematic illustration of a method for forming an electrical contact 16 according to various exemplary embodiments.

FIG. 1A shows a silicon carbide substrate ("substrate" for short) 10, with a surface 101. The silicon carbide substrate 10 may be for example an SiC wafer. The substrate 10 may have a thickness T, for example a thickness of between approximately 250 μm and approximately 450 μm or more. The surface 101 may be a first principal surface 101 of the silicon carbide substrate 10. The silicon carbide substrate 10 may include a second principal surface 102, on the opposite side to the first principal surface 101. The text below describes forming the electrical contact 16 on the entire surface 101. In various exemplary embodiments, the electrical contact 16 may be formed on a partial region or a plurality of mutually connected or mutually separated partial regions of the surface 101. In various exemplary embodiments, the electrical contact 16 may, as an alternative or in addition, be formed on the second principal surface 102, for example on the entire second principal surface 102 or on a partial region or a plurality of mutually connected or mutually separated partial regions of the second principal surface 102.

Figure 4:
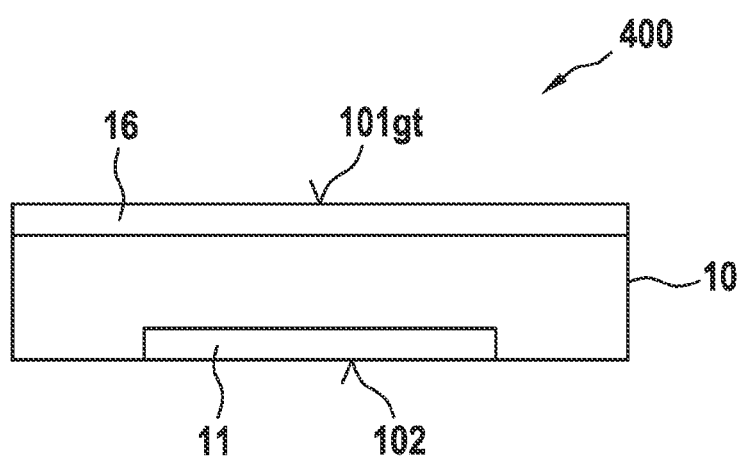
FIG. 4 shows a semiconductor device that was manufactured with the aid of a method for forming a semiconductor device according to various exemplary embodiments of the present invention.

According to various exemplary embodiments of the present invention, an electronic semiconductor component 11 may be formed in the substrate 10 (indicated schematically in FIG. 1A; see also FIG. 4). The semiconductor component 11 may take the form, for example, of a vertical component in the substrate 10 such that it extends from the second principal surface 102, into the substrate 10, and to an electrode to be formed on the first principal surface 101. For example, the electronic semiconductor component 11 may be a vertical transistor, and the electrical contact 16 on the first principal surface 101 may be a drain electrode or a contact layer for a drain electrode. The transistor may be for example a (power) MOSFET, or another suitable vertical component. In various exemplary embodiments, the method for forming an electrical contact 16 may be used to form at least one electrical contact 16, for example at least one electrode, for a lateral electronic semiconductor component. FIG. 1B shows the substrate 10 after its surface 101 has been ground. The ground surface is accordingly provided with the reference character 101g.

The grinding allows the thickness T of the substrate 10 to be reduced to the smaller thickness Tg. In various exemplary embodiments, the grinding may substantially include a grinding process that is in any case typically performed for the purpose of thinning the substrate 10. In this case, the silicon carbide substrate 10 may be thinned to a smaller thickness Tg of approximately 50 μm to approximately 200 μm. In various exemplary embodiments, the grinding may be a process serving to form the electrical contact 16, for example in cases where the electric contact 16 is formed on the principal surface 101 or 102 which includes the electronic component.

Grinding may be carried out with the aid of a grinding disk or other suitable grinding tool. In its grinding face, the grinding disk may include nickel and/or a nickel compound, such as a nickel alloy. A nickel content of the grinding disk may be between approximately 0.1 weight % and 100 weight %. In other words, the grinding disk may be made entirely or only partly of nickel. Where the grinding disk is made only partly of nickel, it may for example furthermore include a glass or ceramic material, such as $SiO_2$, ZnO and/or CaO. The nickel may be embedded in the glass or ceramic material, for example in the form of nickel particles.

The nickel-containing grinding face may be configured, for example in respect of its roughness, such that the grinding roughens the surface 101, and a crystal structure of the silicon carbide is damaged. Furthermore, nickel particles 12 may be incorporated into the surface 101 or 101g during the grinding. To put it another way, the grinding may form recesses 13 and damage 14 to the crystal lattice (such as microcracks, displacements and/or pores) in the surface 101g, and furthermore the nickel particles 12 may be incorporated on and/or in the surface 101g of the substrate 10. The nickel particles 12 may, for example, be arranged in the recesses 13 and at points where there is damage 14 to the crystal lattice. The grinding may be performed such that the recesses 13, the crystal lattice damage 14, and the nickel particles 12 extend into the substrate 10 to a depth d of from approximately 10 nm to approximately 500 nm. The region close to the surface, where the crystal lattice damage 14, the recesses 13 and the incorporated nickel 12 are present, is also called the region of damage.

In order to achieve a predetermined depth of the region of damage, and a desired quantity of nickel 12 embedded in it, parameters relating to the grinding process can be adjusted, such as the nickel content and the roughness of the grinding disk, the duration of grinding, contact pressure during the grinding process, etc. In various exemplary embodiments, the objective may be a greater depth of the region of damage (for example between 200 nm and 500 nm), for example, if there is provision to utilize the electrical contact 16 that is formed directly as an electrode, and/or if the electrical contact 16 forms the rear-side electrode of the semiconductor component. Conversely, the objective may be a smaller depth (for example between 10 nm and 200 nm) of the region of damage if there is provision for the electrical contact 16 that is formed to serve merely as a seed layer for depositing a further electrically conductive layer, and/or if the electrical contact 16 forms at least one front-side electrode.

An average roughness Ra of the ground surface 101g may be between approximately 10 nm and approximately 500 nm, for example between approximately 10 nm and approximately 50 nm.

In various exemplary embodiments, after the grinding the substrate 10 may simultaneously have all the properties mentioned above, namely a thickness Tg of the substrate 10 of approximately 50 μm<Tg<200 μm, an average roughness Ra of approximately 10 nm<Ra<500 nm and a region of damage having a thickness of between approximately 10 nm and approximately 500 nm, and nickel and/or nickel compounds 12 that are arranged on the ground surface 101g and/or in the region of damage.

FIG. 1C shows the silicon carbide substrate 10 with the ground surface 101g during a hardening process. The hardening may be performed by a laser, of which the laser light 18 irradiates the ground surface 101g. Irradiation with the laser light 18—the hardening—may be performed such that the defects (the recesses 13 and the damage 14 to the crystal lattice) are lessened or reduced, such that at least some of the nickel or nickel compounds 12 reacts with the silicon of the silicon carbide substrate 10 (for example forming nickel silicide), and an ohmic contact 16 is formed at the surface 101g, it being possible for the contact 16 to have a contact resistance of less than 1 mΩcm². The surface that is obtained after hardening, with the ohmic contact 16, is indicated in FIG. 1C by the reference character 101gt.

The left-hand side of FIG. 1C shows that, after irradiation of the ground surface 101g by the laser light 18, the defects can be reduced or eliminated. In various exemplary embodiments, the laser light 18 may have a wavelength of less than 400 nm, and an energy density of more than 2 J/cm².

During the laser hardening, recrystallization may take place. This may result in a change (reduction) in the surface roughness. For example, the average roughness Ra after hardening may be less than half the average roughness Ra before hardening.

Furthermore, laser hardening may have the result that the nickel 12 in the layer close to the surface forms a chemical compound with the silicon (for example forming nickel silicide), and furthermore that some of the silicon vaporizes. The nickel silicide compound formed by the laser hardening may form an electrically conductive layer and hence the electrical connection (the contact) 16. The thickness of the electrically conductive connection 16 may be in a range of from approximately 10 nm to approximately 500 nm, for example between approximately 10 nm and approximately 50 nm.

If, as described above, the electrical connection is formed only on a partial region of the surface of the substrate 10, this may be achieved in that only the partial region of the surface 101 is ground and then irradiated with the laser light 18, and/or in that, although the entire surface 101 is ground, hardening is only performed on the partial region of the surface 101. In the event that the entire surface 101 has been ground but the electrical connection is/was only formed in a partial region of the surface 101, it is possible to arrange a protective layer (not illustrated) on the ground, non-irradiated region.

In various exemplary embodiments, the electrically conductive contact 16 may directly form the electrode of the electronic semiconductor component. In various exemplary embodiments, the electrically conductive contact 16 may be a bottom layer of a stack of layers forming the electrode. To put it another way, the electrically conductive contact 16 may be utilized as the ground layer or seed layer for applying (for example, galvanically) at least one further electrically conductive layer.

Figure 2:
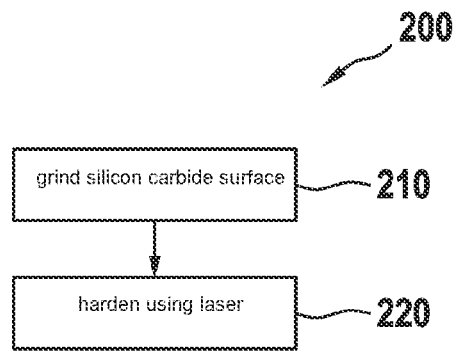
FIG. 2 shows a flow diagram of a method for forming an electrical contact according to various exemplary embodiments of the present invention.

FIG. 2 shows a flow diagram of a method 200 for forming an electrical contact, according to various exemplary embodiments.

The method may include grinding a silicon carbide surface with a grinding disk that has a grinding face containing nickel or a nickel compound, such that particles of the nickel or nickel compound from the grinding disk are embedded in the ground silicon carbide surface (210), and hardening the ground silicon carbide surface with the aid of a laser, such that at least some of the embedded nickel particles form a nickel silicide with silicon from the silicon carbide (220).

Figure 3:
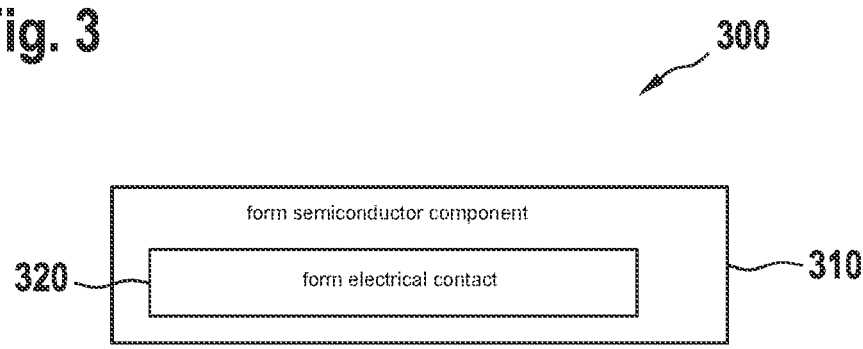
FIG. 3 shows a flow diagram of a method for forming a semiconductor device according to various exemplary embodiments of the present invention.

FIG. 3 shows a flow diagram of a method 300 for forming a semiconductor device, according to various exemplary embodiments.

The method may include forming a semiconductor component in a silicon carbide substrate (310), where formation of an electrode of the semiconductor component includes the method for forming an electrical contact according to one of the exemplary embodiments above (320).

The method may be performed at wafer level. This likewise applies to the method for forming the electrical contact according to various exemplary embodiments.

In various exemplary embodiments, the semiconductor component may be a transistor.

FIG. 4 shows a semiconductor device 400 that was manufactured by a method for forming a semiconductor device according to various exemplary embodiments, for example as set forth in detail above.

The semiconductor device 400 includes a silicon carbide substrate 10 with an electrical contact 16 which is formed on it and forms a surface 101gt of the semiconductor device 400.

Furthermore, the semiconductor device 400 includes a semiconductor component 11 which is formed in the substrate 10 and extends for example from a second surface 102 into the substrate 10. The electrical contact 16 may for example be a rear-side electrode of the semiconductor component 11.

What is claimed is:

1. A method for forming an electrical contact, comprising:
grinding a silicon carbide surface using a grinding disk which includes a grinding face containing nickel or a nickel compound, such that particles of the nickel or nickel compound from the grinding disk are embedded in the ground silicon carbide surface; and
hardening the ground silicon carbide surface using a laser, such that at least some of the embedded nickel particles form a nickel silicide with silicon from the silicon carbide.

2. The method as recited in claim 1, wherein the nickel silicide forms a surface layer that has an average roughness of 10 nm<Ra<500 nm.

3. The method as recited in claim 1, wherein the grinding of the silicon carbide surface includes thinning a silicon carbide substrate to a thickness of between 50 μm and 200 μm.

4. The method as recited in claim 1, wherein the ground silicon carbide surface has an average roughness Ra of 10 nm<Ra<500 nm.

5. The method as recited in claim 1, wherein the grinding disk contains between 0.1 weight % and 100 weight % of nickel.

6. The method as recited in claim 1, wherein the hardening includes irradiation using laser light having a wavelength of less than 400 nm.

7. The method as recited in claim 1, wherein the hardening includes irradiation with using laser light having an energy density of more than 2 J/cm$^2$ and less than 5 J/cm$^2$.

8. A method for forming a semiconductor device, comprising:
forming a semiconductor component in a silicon carbide substrate, including:
forming an electrode of the semiconductor component by:
grinding a silicon carbide surface using a grinding disk which includes a grinding face containing nickel or a nickel compound, such that particles of the nickel or nickel compound from the grinding disk are embedded in the ground silicon carbide surface, and
hardening the ground silicon carbide surface using a laser, such that at least some of the embedded nickel particles form a nickel silicide with silicon from the silicon carbide.

9. The method as recited in claim 8, wherein the semiconductor device is a transistor.

10. The method as recited in claim 1, wherein the method is performed at wafer level.

11. A semiconductor device formed in a silicon carbide substrate, the semiconductor device including an electrode formed by grinding a silicon carbide surface using a grinding disk which includes a grinding face containing nickel or a nickel compound, such that particles of the nickel or nickel compound from the grinding disk are embedded in the ground silicon carbide surface, and hardening the ground silicon carbide surface using a laser, such that at least some of the embedded nickel particles form a nickel silicide with silicon from the silicon carbide.

12. The device as recited in claim 11, wherein the semiconductor device is a transistor.

* * * * *